United States Patent
Zhang et al.

(10) Patent No.: US 12,117,352 B2
(45) Date of Patent: Oct. 15, 2024

(54) METHOD, DEVICE AND SYSTEM FOR MONITORING IGBT JUNCTION TEMPERATURE

(71) Applicant: Tsinghua University, Beijing (CN)

(72) Inventors: Pinjia Zhang, Beijing (CN); Yanyong Yang, Beijing (CN)

(73) Assignee: Tsinghua University, Beijing (CN)

(*) Notice: Subject to any disclaimer, the term of this patent is extended or adjusted under 35 U.S.C. 154(b) by 458 days.

(21) Appl. No.: 17/511,233

(22) Filed: Oct. 26, 2021

(65) Prior Publication Data

US 2022/0334001 A1     Oct. 20, 2022

(30) Foreign Application Priority Data

Apr. 7, 2021   (CN) .......................... 202110373619.7

(51) Int. Cl.
*G01K 7/01*   (2006.01)
*H03K 17/567*   (2006.01)

(52) U.S. Cl.
CPC ........... *G01K 7/015* (2013.01); *H03K 17/567* (2013.01); *G01K 2217/00* (2013.01)

(58) Field of Classification Search
CPC .......................... G01K 7/015; G01K 2217/00
See application file for complete search history.

(56) References Cited

U.S. PATENT DOCUMENTS

2018/0003574 A1* 1/2018 Jang .................... G01K 7/01
2019/0250046 A1* 8/2019 Sun .................... G01R 31/2619

FOREIGN PATENT DOCUMENTS

CN        105910730 A  *  8/2016  ............. G01K 13/00
EP          2031753 A2  *  3/2009  ............. H02P 27/08

* cited by examiner

*Primary Examiner* — Mirellys Jagan
(74) *Attorney, Agent, or Firm* — Westbridge IP LLC

(57) ABSTRACT

The invention relates to a method, a device and a system for monitoring the IGBT junction temperature, wherein the linear relationship between each turn-off DC bus ringing peak voltage and the corresponding turn-off IGBT junction temperature, the phase current directions, and the initial and secondary states of the half-bridge arms are used to accurately determine the monitoring time of the turn-off DC bus ringing peak voltage, thereby obtaining the IGBT junction temperature at a converter level with higher sensitivity. The IGBT junction temperature obtained using the junction temperature monitoring method provided by the invention is an appropriate converter-level parameter, which has a good application prospect in multi-IGBT junction temperature estimation.

12 Claims, 4 Drawing Sheets

METHOD, DEVICE AND SYSTEM FOR MONITORING IGBT JUNCTION TEMPERATURE

CROSS-REFERENCE TO RELATED APPLICATION

This application claims priority from the Chinese patent application 202110373619.7 filed Apr. 7, 2021, the content of which is incorporated herein in the entirety by reference.

TECHNICAL FIELD

The invention relates to the technical field of power electronics, and in particular to a method, a device and a system for monitoring IGBT junction temperature.

BACKGROUND OF THE INVENTION

Power electronic converters are widely used in industrial production and life. A power electronic device is one of the most critical components in a power electronic converter and an IGBT is the most used among power electronic devices. However, IGBT failures have always been a problem for engineering applications and IGBT malfunctions seriously affect the safe and stable operation of a converter system. According to statistical data, 55% of IGBT failures are caused by temperature rise and thermal cycling. Therefore, IGBT temperature monitoring has great significance for the state monitoring and operation optimization of IGBTs and converters.

There have been a plurality of research reports on IGBT junction temperature estimation in the prior art, for example, a method of directly measuring the junction temperature using an infrared camera. However, the method requires opening the encapsulation of an IGBT module, which has great limitations in practical application. Alternatively, the IGBT junction temperature has been estimated by using the negative temperature coefficient (NTC) thermistor of an IGBT module heat dissipation plate. However, most half-bridge modules have only one NTC thermistor, so it is difficult to distinguish between the junction temperatures of the upper and lower IGBTs on a bridge arm. In recent years, methods based on thermal sensitive electrical parameters have received wide attention due to their advantages such as easy integration and fast response speed. The existing methods based on thermal sensitive electrical parameters may be divided into two types according to the signal types: one is based on the signal between the gate and emitter of an IGBT, and the other is based on the signal between the collector and emitter of an IGBT.

Firstly, based on the signal between the gate and emitter of an IGBT, an IGBT gate threshold voltage, a gate Miller platform voltage, a gate-driving resistance and a gate-driving current peak inside an IGBT, an IGBT turn-on delay time, and an IGBT turn-off time are all related to the IGBT junction temperature. However, a sampling circuit based on a gate signal is complicated and the resolution of detecting the IGBT junction temperature by a gate signal is relatively low.

Secondly, based on the signal between the collector and emitter of an IGBT, there has a linear relationship between the on-state voltage drop and the IGBT junction temperature, so the method based on an on-state voltage drop is a popular method at present. However, an on-state voltage drop under a high current is not only affected by temperature, but also by the failure of bond wires inside an IGBT module. An on-state voltage drop under a low current usually needs to be realized by additional injection of a low current, which interferes with the operation of a circuit. The junction temperature monitoring based on a collector saturation current is also favored by numerous researchers. However, intermittent extraction is inevitably required for online measurement of a saturation current, which interferes with the normal operation of a circuit. Due to a blocking direct-current (DC) bus voltage, an IGBT in a turn-off state generates a leakage current, which has a non-linear relationship with temperature and is difficult to be precisely measured within the full temperature range.

Therefore, the existing methods for monitoring IGBT junction temperature have the disadvantages of low resolution, great difficulty in online monitoring and the like, and another problem is that they are all device-level junction temperature extraction methods. In a case of a multi-IGBT converter, the same number of monitoring devices as IGBTs are required. A power electronic converter generally comprises a plurality of IGBTs. For example, a three-phase inverter comprises 6 IGBTs. For a multi-level power electronic converter, the number of IGBTs may reach up to tens or even hundreds. If a conventional device-level junction temperature monitoring method is adopted, junction temperature monitoring is obviously required on all IGBTs inside a converter, whereby an IGBT monitoring circuit will obviously be complicated and bulky. Accordingly, it is necessary to develop a method that can extract the junction temperature information of all IGBTs in a converter from the parameters at a converter level.

SUMMARY OF THE INVENTION

Based on the prior art, the present invention aims to provide a simple, high-resolution, economical and practical converter-level method for monitoring IGBT junction temperature to precisely monitor and control the IGBT junction temperature at a converter level.

In order to achieve the above objective, one aspect of the invention provides a method for monitoring IGBT junction temperature, wherein the method monitors the IGBT junction temperature in a converter, comprising the following steps:

measuring the DC bus voltage steady-state value;

monitoring the phase current of the phase where an IGBT is located, and determining the monitoring time of the IGBT junction temperature according to the direction of the phase current and the initial and secondary states of the half-bridge arm where the IGBT is located;

monitoring the DC bus voltage at the junction temperature monitoring time, which in turn serves as the DC bus ringing peak voltage of the IGBT;

and determining the junction temperature of the IGBT based on the DC bus ringing peak voltage, the steady-state value of the DC bus voltage, and the phase current.

Further, the monitoring time of the IGBT junction temperature is determined according to the direction of the phase current and the initial and secondary states of the half-bridge arm where the IGBT is located, comprising:

determining the monitoring time of the IGBT junction temperature according to the following logic transfer equation:

$$T_{upper} = CV_0 \overline{V_1}.$$

$$T_{lower} = \overline{CV_0} V_1.$$

wherein $T_{upper}$ is the junction temperature monitoring time of the upper IGBT on the half-bridge arm; $T_{lower}$ is the junction temperature monitoring time of the lower IGBT on the half-bridge arm; C is the current direction of the phase where the IGBT is located, wherein a current flowing out of the bridge arm is positive and a current flowing into the bridge arm is negative; and $V_0$ is the initial state of the half-bridge arm in the phase where the IGBT is located, and $V_1$ is the secondary state of the half-bridge arm in the phase where the IGBT is located. Note: $V_0$ and $V_1$ are 1 when the IGBT is turned on. $V_0$ and $V_1$ are 0 when the IGBT is turned off.

Further, the junction temperature of the IGBT is determined based on the DC bus ringing peak voltage, the steady-state value of the DC bus voltage and the phase current, comprising:

determining the IGBT junction temperature according to the following equation:

$$V_{bus\_m} = V_{bus} + (a+bT)V_{bus}i_L.$$

wherein T is the junction temperature of an IGBT; $V_{bus}$ is the steady-state value of the DC bus voltage; $i_L$ is the phase current; $V_{bus\_m}$ is the peak voltage of the DC bus ringing; and a is a first calibration coefficient, and b is a second calibration coefficient.

Further, the steady-state value $V_{bus}$ of the DC bus voltage is measured, comprising:

sampling the DC bus voltage;

and processing the sampled DC bus voltage with a low-pass filter to obtain the steady-state value $V_{bus}$ of the DC bus voltage.

Further, the DC bus voltage is monitored at the junction temperature monitoring time, which in turn serves as the DC bus ringing peak voltage $V_{bus\_m}$ of the IGBT, comprising:

sampling the DC bus voltage at the junction temperature monitoring time;

and processing the sampled DC bus voltage with a high-pass filter to obtain the DC bus ringing peak voltage $V_{bus\_m}$.

Further, the phase current is monitored, and the DC bus ringing peak voltage of the IGBT is obtained when the phase current reaches the peak.

A second aspect of the invention provides a device for monitoring IGBT junction temperature, which monitors the IGBT junction temperature in a converter, comprising a DC bus voltage steady-state value acquisition unit, a junction temperature monitoring time determination unit, a DC bus ringing peak voltage acquisition unit and a junction temperature determination unit, wherein, the DC bus voltage steady-state value acquisition unit measures the steady-state value of the DC bus voltage;

the junction temperature monitoring time determination unit monitors the phase current of the phase where the IGBT is located, and determines the monitoring time of the IGBT junction temperature according to the direction of the phase current and the initial and secondary states of the half-bridge arm where the IGBT is located;

the DC bus ringing peak voltage acquisition unit monitors the DC bus voltage at the junction temperature monitoring time, which in turn serves as the DC bus ringing peak voltage of the IGBT;

and the junction temperature determination unit determines the junction temperature of the IGBT based on the DC bus ringing peak voltage, the steady-state value of the DC bus voltage and the phase current.

Further, the junction temperature monitoring time determination unit determines the monitoring time of the IGBT junction temperature according to the direction of the phase current and the initial and secondary states of the half-bridge arm where the IGBT is located, comprising:

determining the monitoring time of the IGBT junction temperature according to the following logic transfer equation:

$$T_{upper} = C V_0 \overline{V_1}.$$

$$T_{lower} = \overline{C V_0} V_1.$$

wherein $T_{upper}$ is the junction temperature monitoring time of the upper IGBT on the half-bridge arm; $T_{lower}$ is the junction temperature monitoring time of the lower IGBT on the half-bridge arm; C is the current direction of the phase where the IGBT is located, wherein a current flowing out of the bridge arm is positive and a current flowing into the bridge arm is negative; and $V_0$ is the initial state of the half-bridge arm in the phase where the IGBT is located, and $V_1$ is the secondary state of the half-bridge arm in the phase where the IGBT is located.

Further, the junction temperature determination unit determines the junction temperature of the IGBT based on the DC bus ringing peak voltage, the steady-state value of the DC bus voltage and the phase current, comprising:

determining the junction temperature of the IGBT according to the following equation:

$$V_{bus\_m} = V_{bus} + (a+bT)V_{bus}i_L.$$

wherein T is the junction temperature of an IGBT; $V_{bus}$ is the steady-state value of the DC bus voltage; $i_L$ is the phase current; $V_{bus\_m}$ is the peak voltage of the DC bus ringing; and a is a first calibration coefficient, and b is a second calibration coefficient.

A third aspect of the invention provides a system configured to monitor IGBT junction temperature, comprising: a converter, a control and signal processor, and an IGBT junction temperature monitoring device, wherein, the converter, which is configured to supply power to a load, comprises 2n IGBTs which constitute n half-bridge structures, wherein n is a natural number greater than or equal to 1;

the control and signal processor controls the on-off state of the IGBT on each half bridge;

and the IGBT junction temperature monitoring device comprises the IGBT junction temperature monitoring device described in any one of claims 7-9.

To sum up, the invention provides a method, a device and a system for monitoring IGBT junction temperature, wherein the linear relationship between each turn-off DC bus ringing peak voltage and the corresponding IGBT junction temperature, the phase current direction, and the initial and secondary states of the half-bridge arms are used to accurately determine the monitoring time of the turn-off DC bus ringing peak voltage, thereby obtaining the IGBT junction temperature at a converter level with higher sensitivity. More importantly, the IGBT junction temperature obtained using the junction temperature monitoring method provided by the invention is an appropriate converter-level parameter, which has a good application prospect in multi-IGBT junction temperature estimation. In addition, the bus voltage ringing of a power electronic converter, which is free from the impact of parasitic parameters inside an IGBT module, is independent from the degradation of the bond wires inside an IGBT. The monitoring method provided by the invention can facilitate the beneficial technical effects of a less complicated monitoring circuit, a simplified monitoring circuit structure, low costs, convenient installation, high resolution, noninterference with the circuit operation, independence from the failure of bond wires, and the like.

DETAILED DESCRIPTION OF EMBODIMENTS

To further clarify the purpose, technical schemes, and advantages of the present invention, the invention will be described in further detail below in light of specific embodiments and with reference to the appended drawings. It should be understood that these descriptions are exemplary only and are not intended to limit the scope of the invention. Additionally, a description of well-known structures and techniques is omitted in the following demonstration to avoid unnecessarily confusing the concepts of the present invention.

The technical schemes of the invention will be described in detail with reference to the appended drawings. As for the above mentioned challenges in IGBT junction temperature monitoring, the present invention proposes a converter-level method for monitoring IGBT junction temperature based on bus voltage ringing. A plurality of studies have shown that there is a linear relationship between the decreasing rate of current change in the IGBT collector and the IGBT junction temperature. However, a decreased rate of current change in the IGBT collector will generate an induced voltage on the parasitic inductance, and the induced voltage can be monitored by monitoring the bus voltage ringing during an IGBT turn-off transient. Therefore, there is a linear relationship between each turn-off bus voltage ringing and the corresponding IGBT junction temperature. In practice, the equivalent series inductance (ESL) of the bus capacitor and the stray inductance of the DC bus bar are usually tens of nanohenries (about 30 nH). However, the typical sensitivity of an IGBT turn-off current change rate with temperature is about $3.344 \cdot 10^6$ A/(s·° C.). Therefore, the typical resolution of IGBT junction temperature estimation based on bus voltage ringing is about 100 mV/° C., which is higher than the resolution of most existing methods.

A three-phase inverter is taken as an example below to demonstrate the embodiments of the invention. In practical application, the monitoring method provided by the present invention may be used in other single-phase and multi-phase converters. When the parasitic inductance of the DC bus capacitor, the parasitic inductance of the bus bar, the parasitic inductance inside an IGBT module and other parameters are considered, the equivalent circuit of a three-phase inverter is shown in FIG. 1.

Figure 1:
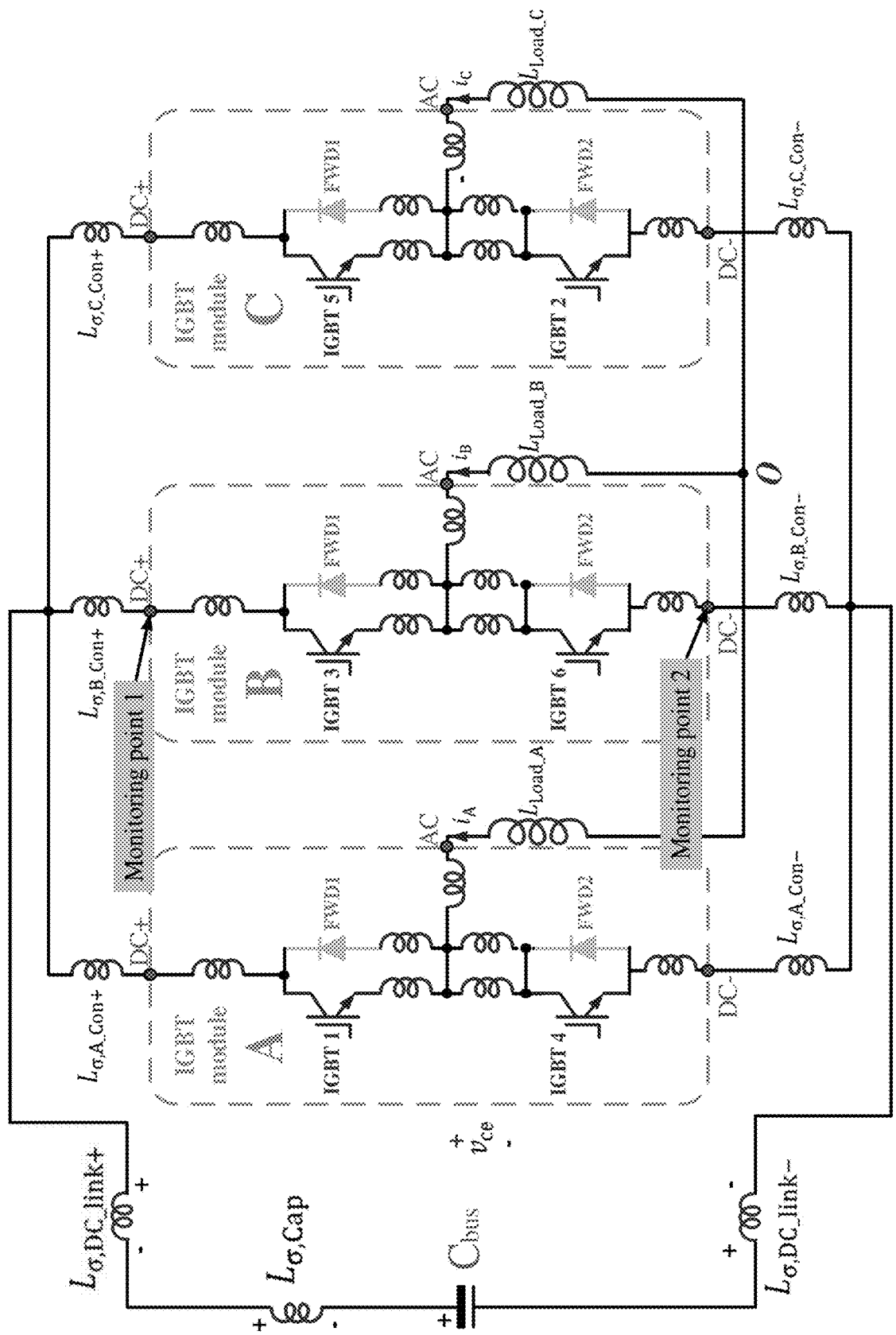
FIG. 1 is an equivalent circuit of a three-phase inverter, wherein parasitic parameters are considered.

In FIG. 1, $i_A$, $i_B$ and $i_C$ are the currents at the midpoints of the three bridge arms (the flow into a bridge arm is in the negative direction). $L_{\sigma,Cap}$ is the parasitic inductance of the DC bus capacitor and $L_{\sigma,DC\_link+}$ is the metal bus bar stray inductance of the DC bus positive electrode; $L_{\sigma,DC\_link-}$ is the metal bus bar stray inductance of the DC bus negative electrode; and $L_{\sigma,A\_Con+}$, $L_{\sigma,B\_Con+}$ and $L_{\sigma,C\_Con+}$ are the stray inductance of the connection line between the DC bus bar and the positive electrode of the three-phase (A, B and C) IGBT modules. $L_{\sigma,A\_Con-}$, $L_{\sigma,B\_Con-}$ and $L_{\sigma,C\_Con-}$ are the stray inductance of the connection line between the DC bus bar and the negative electrode of the three-phase (A, B and C) IGBT modules. $L_{Load\_A}$, $L_{Load\_B}$ and $L_{Load\_c}$ are the equivalent load impedance in the three phases of A, B and C.

As shown in FIG. 1, the voltage monitoring points (monitoring point 1 and 2) are respectively set at the positive and the negative DC terminals of IGBT module B. As the terminal voltage of each phase is monitored, the peak voltages of all IGBTs at a turn-off instant are:

In Phase A, when IGBT 1 and IGBT 4 are turned off, the peak voltage of the bus ringing is:

$$V_{bus\_m} = V_{bus} + (L_{\sigma,Cap} + L_{\sigma,DC\_link+} + L_{\sigma,DC\_link-}) \cdot \max\left(\left|\frac{di_A}{dt}\right|\right).$$

In Phase B, when IGBT 3 and IGBT 6 are turned off, the peak voltage of the bus ringing is:

$$V_{bus\_m} = V_{bus} + (L_{\sigma,Cap} + L_{\sigma,DC\_link+} + L_{\sigma,B\_Con+} + L_{\sigma,B\_Con-} + L_{\sigma,DC\_link-}) \cdot \max\left(\left|\frac{di_B}{dt}\right|\right).$$

In Phase C, when IGBT 5 and IGBT 2 are turned off, the peak voltage of the bus ringing is:

$$V_{bus\_m} = V_{bus} + (L_{\sigma,Cap} + L_{\sigma,DC\_link+} + L_{\sigma,DC\_link-}) \cdot \max\left(\left|\frac{di_C}{dt}\right|\right).$$

Figure 2:
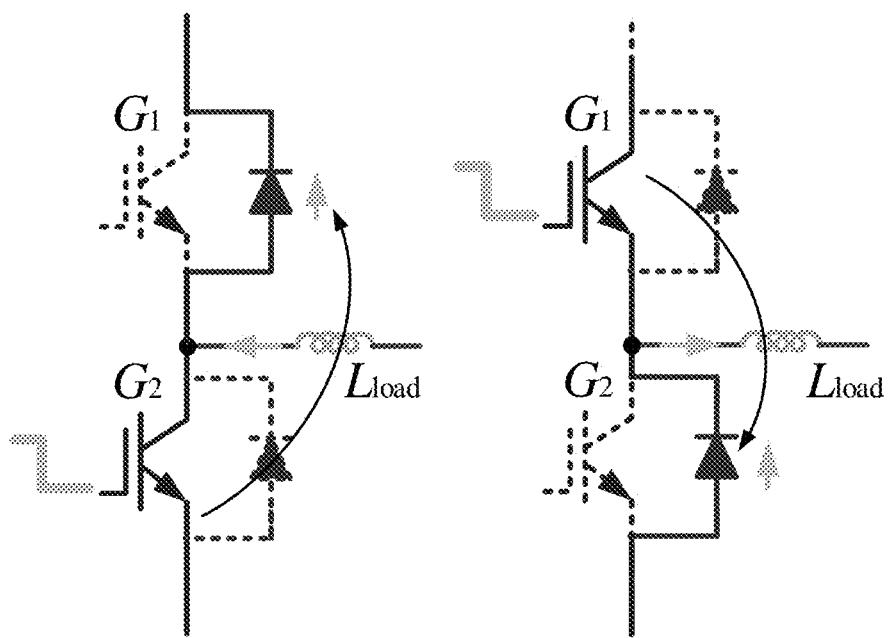
FIG. 2 is a schematic diagram of the switching states and the corresponding current transfer directions of a three-phase inverter in different current directions.

A three-phase inverter circuit is composed of three IGBT half bridges, and the monitoring time of each IGBT half-bridge module is set at the moment of one of its IGBTs being turned off. When the current is negative (that is, flowing into the bridge arm), the DC bus ringing at the turn-off moment of a lower IGBT is selected as the thermal sensitive parameter for monitoring the junction temperature of the lower IGBT. Similarly, when the current is positive (that is, flowing out of the bridge arm), the DC bus ringing at the turn-off moment of an upper IGBT is selected as the thermal sensitive parameter for monitoring the junction temperature of the upper IGBT. In different current directions, the switching states and the corresponding current transfer directions are shown in FIG. 2.

Figure 3:
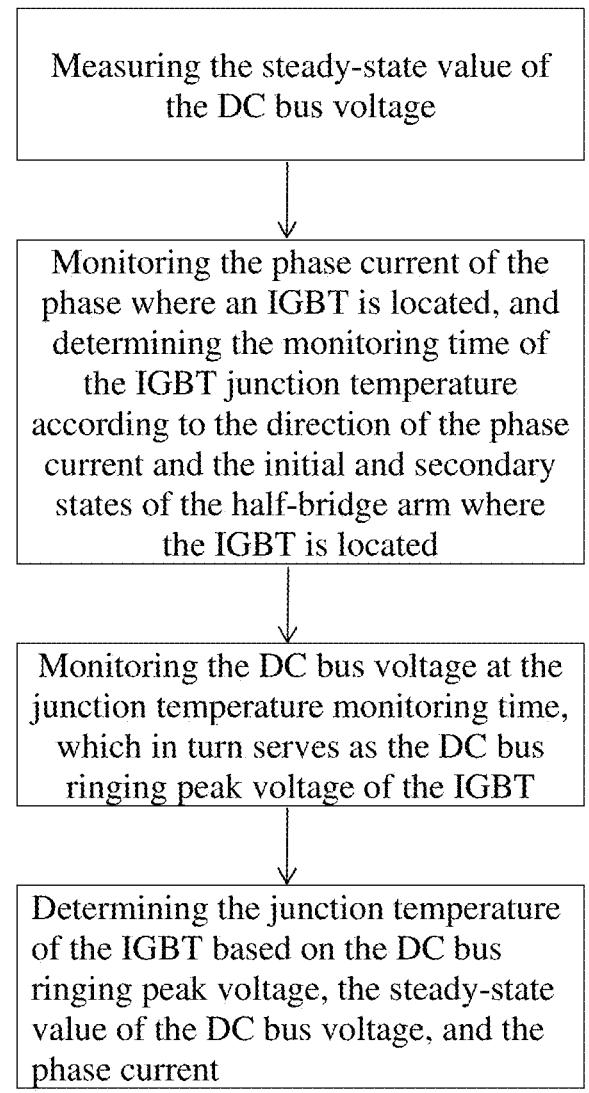
FIG. 3 is a flow chart of the IGBT junction temperature monitoring method of the present invention.

According to an embodiment of the invention, a method for monitoring IGBT junction temperature is provided to monitor the IGBT junction temperature in a converter. The flow chart of the method is shown in FIG. 3, comprising the following steps:

measuring the steady-state value of the DC bus voltage. By monitoring the DC bus voltage, the steady-state value of the bus voltage can be obtained from the output DC bus voltage via a low-pass filter, wherein the cut-off frequency should be far less than the switching frequency, and monitoring the phase current of the phase where an IGBT is located, and determining the monitoring time of the IGBT junction temperature according to the direction of the phase current and the initial and secondary states of the half-bridge arm where the IGBT is located. The specific analysis is as follows:

For a typical motor load, the type of load in each phase is an inductive load. In the condition of an inductive load, the current lags behind the voltage direction. The positive direction of a current is defined as the direction of a current flowing away from the midpoint of a bridge arm while the negative direction is defined as the direction of a current flowing towards the midpoint of a bridge arm. In addition, we define the switching state of an upper IGBT on a bridge arm as "1", wherein the midpoint voltage of the bridge arm is high level. Similarly, we define the switching state of a lower IGBT on a bridge arm as "0", wherein the midpoint voltage of the bridge arm is low level. Based on the midpoint current direction and the switching state of a bridge arm, the current direction and the initial and secondary switching states of the bridge arm of each IGBT at the monitoring time are shown in Table 1.

TABLE 1

Current direction and initial and secondary switching states of bridge arm of each IGBT at monitoring time

| Phase | IGBT No. | Current direction | Initial state of bridge arm | Secondary state of bridge arm |
|---|---|---|---|---|
| A | IGBT 1 | + | 100 | 000 |
|   |        |   | 101 | 001 |
|   |        |   | 110 | 010 |
|   |        |   | 111 | 011 |
| A | IGBT 4 | − | 000 | 100 |
|   |        |   | 001 | 101 |
|   |        |   | 010 | 110 |
|   |        |   | 011 | 111 |
| B | IGBT 3 | + | 010 | 000 |
|   |        |   | 011 | 001 |
|   |        |   | 110 | 100 |
|   |        |   | 111 | 101 |
| B | IGBT 6 | − | 000 | 010 |
|   |        |   | 001 | 011 |
|   |        |   | 100 | 110 |
|   |        |   | 101 | 111 |
| C | IGBT 5 | + | 001 | 000 |
|   |        |   | 011 | 010 |
|   |        |   | 101 | 100 |
|   |        |   | 111 | 110 |
| C | IGBT 2 | − | 000 | 001 |
|   |        |   | 010 | 011 |
|   |        |   | 100 | 101 |
|   |        |   | 110 | 111 |

In Table 1, the initial state of a bridge arm represents the switching state of a three-phase inverter before switching, and the secondary state of a bridge arm represents the switching state of a three-phase inverter after switching. In order to better determine the monitoring time in practice, the current in each phase and the initial and secondary switching states of the bridge arm in each phase are represented by the symbols in Table 2.

TABLE 2

Names of variates and corresponding symbols

| Names of variates | Symbols |
|---|---|
| Current direction of Phase A | $C_A$ |
| Current direction of Phase B | $C_B$ |

TABLE 2-continued

Names of variates and corresponding symbols

| Names of variates | Symbols |
|---|---|
| Current direction of Phase C | $C_C$ |
| Initial state of Phase A half-bridge arm | $V_{A0}$ |
| Initial state of Phase B half-bridge arm | $V_{B0}$ |
| Initial state of Phase C half-bridge arm | $V_{C0}$ |
| Secondary state of Phase A half-bridge arm | $V_{A1}$ |
| Secondary state of Phase B half-bridge arm | $V_{B1}$ |
| Secondary state of Phase C half-bridge arm | $V_{C1}$ |

Therefore, the logic transfer equation of the junction temperature monitoring time for each IGBT can be easily obtained according to the states in Table 1 and the symbols in Table 2.

For IGBT 1, the logic transfer equation of the junction temperature monitoring time is:

$$T_1 = C_A V_{A0} \overline{V_{A1}}.$$

For IGBT 4, the logic transfer equation of the junction temperature monitoring time is:

$$T_4 = \overline{C_A} \overline{V_{A0}} V_{A1}.$$

For IGBT 3, the logic transfer equation of the junction temperature monitoring time is:

$$T_3 = C_B V_{B0} \overline{V_{B1}}.$$

For IGBT 6, the logic transfer equation of the junction temperature monitoring time is:

$$T_6 = \overline{C_B} \overline{V_{B0}} V_{B1}.$$

For IGBT 5, the logic transfer equation of the junction temperature monitoring time is:

$$T_5 = C_C V_{C0} \overline{V_{C1}}.$$

For IGBT 2, the logic transfer equation of the junction temperature monitoring time is:

$$T_2 = \overline{C_C} \overline{V_{C0}} V_{C1}.$$

After the junction temperature monitoring time is determined, the DC bus voltage is monitored at the said time, which in turn serves as the DC bus ringing peak voltage of the corresponding IGBT. When the DC bus voltage is monitored, the DC bus ringing peak voltage signal can be obtained from the output DC bus voltage via a high-pass filter which is used mainly to filter the DC part of the bus voltage signal.

The junction temperature of an IGBT is determined based on the DC bus ringing peak voltage, the steady-state value of the DC bus voltage, and the phase current. The junction temperature of an IGBT can be determined according to the following equation:

$$V_{bus\_m} = V_{bus} + (a + cT) V_{bus} i_L.$$

wherein T is the junction temperature of an IGBT; $V_{bus}$ is the steady-state value of the DC bus voltage; $i_L$ is the phase current; $V_{bus\_m}$ is the peak voltage of the DC bus ringing; and a is a first calibration coefficient, and b is a second calibration coefficient. In practical converter-level monitoring of junction temperature, it is first of all necessary to calibrate the bus voltage during the turn-off process of an IGBT. That is, the DC bus ringing peak voltage at a turn-off moment shall be monitored under different bus voltages, different load currents and different junction temperatures, and the first and the second calibration coefficients in the above equation can be obtained using the calibration results.

Accordingly, as can be seen from the above analysis, by monitoring only the DC bus ringing peak voltage, the junction temperature of each IGBT in a converter can be monitored based on the switching state and current direction of each phase. The DC bus voltage ripple can be used as a parameter for IGBT junction temperature estimation, which is not only a converter-level identification method, but also is not affected by the degradation of bond wires. A schematic block diagram of a system-level monitoring scheme in practical application is shown in FIG. 4.

Figure 4:
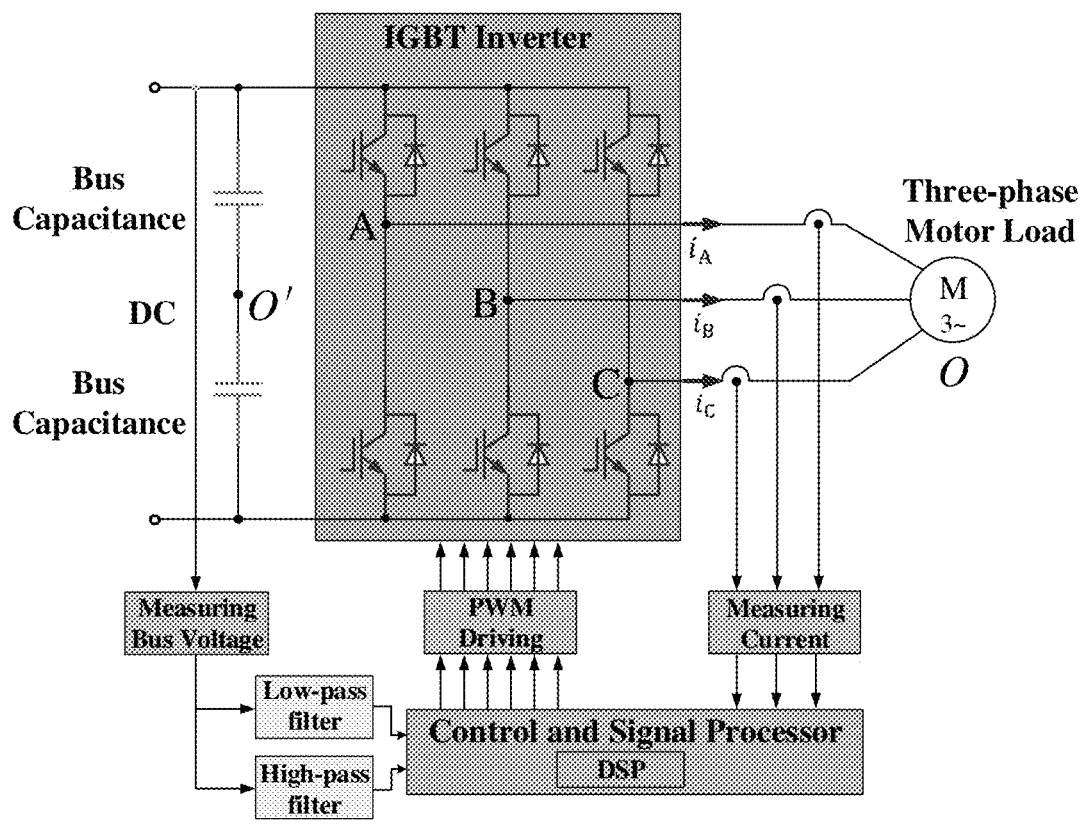
FIG. 4 is a schematic diagram of the IGBT junction temperature monitoring method of the present invention.

As shown in FIG. 4, a typical three-phase inverter is taken as an example of application. First, three current sensors are used to measure the load current (for a three-phase three-wire system, the number of current sensors can be reduced to two). After the three-phase current signal is obtained, the corresponding junction temperature monitoring time of each IGBT can be obtained based on the switching logic sequence in the driving control and according to the logic transfer equation. On the other hand, the DC bus voltage is processed by two modules: a high-pass filter and a low-pass filter, wherein the steady-state value of the bus voltage is obtained via the low-pass filter with the cut-off frequency far less than the switching frequency, and the voltage signal of the bus voltage ringing is obtained via a high-pass filter which is used mainly to filter the DC part of the bus voltage signal. Then, the junction temperature of an IGBT can be calculated according to the previously calibrated linear relationship in temperature monitoring. As can be seen from the above analysis, in a three-phase inverter, the junction temperature of 6 IGBTs can all be monitored in one fundamental wave period. And because the monitoring resolution is positively correlated with the load current, the resolution is the highest when the midpoint current of a half-bridge arm approaches the peak.

According to a second embodiment of the invention, there is provided a device for monitoring IGBT junction temperature, which monitors the IGBT junction temperature in a converter, comprising a DC bus voltage steady-state value acquisition unit, a junction temperature monitoring time determination unit, a DC bus ringing peak voltage acquisition unit and a junction temperature determination unit.

The DC bus voltage steady-state value acquisition unit measures the steady-state value of the DC bus voltage.

The junction temperature monitoring time determination unit monitors the phase current of the phase where the IGBT is located, and determines the monitoring time of the IGBT junction temperature according to the direction of the phase current and the initial and secondary states of the half-bridge arm where the IGBT is located. The monitoring time of the IGBT junction temperature can be determined according to the following logic transfer equation:

$$T_{upper} = CV_0\overline{V_1}.$$

$$T_{lower} = \overline{CV_0}V_1.$$

wherein $T_{upper}$ is the junction temperature monitoring time of the upper IGBT on the half-bridge arm; $T_{lower}$ is the junction temperature monitoring time of the lower IGBT on the half-bridge arm; C is the current direction of the phase where the IGBT is located, wherein a current flowing out of the bridge arm is positive and a current flowing into the bridge arm is negative; and $V_0$ is the initial state of the half-bridge arm in the phase where the IGBT is located, and $V_1$ is the secondary state of the half-bridge arm in the phase where the IGBT is located. Note: $V_0$ and $V_1$ are 1 when the IGBT is turned on. $V_0$ and $V_1$ are 0 when the IGBT is turned off.

The DC bus ringing peak voltage acquisition unit monitors the DC bus voltage at the junction temperature monitoring time, which in turn serves as the DC bus ringing peak voltage of the IGBT.

The junction temperature determination unit determines the junction temperature of an IGBT based on the DC bus ringing peak voltage, the steady-state value of the DC bus voltage and the phase current. The junction temperature of an IGBT can be determined according to the following equation:

$$V_{bus\_m} = V_{bus} + (a+bT)V_{bus}i_L.$$

wherein T is the junction temperature of an IGBT; $V_{bus}$ is the steady-state value of the DC bus voltage; $i_L$ is the phase current; $V_{bus\_m}$ is the peak voltage of the DC bus ringing; and a is a first calibration coefficient, and b is a second calibration coefficient.

According to a third embodiment of the present invention, there is provided a system configured to monitor IGBT junction temperature, comprising a converter, a control and signal processor, and an IGBT junction temperature monitoring device.

The converter, which is configured to supply power to a load, comprises 2n IGBTs which constitute n half-bridge structures, wherein n is a natural number greater than or equal to 1;

The control and signal processor controls the on-off state of the IGBT on each half bridge;

And the IGBT junction temperature monitoring device comprises the IGBT junction temperature monitoring device described in the second embodiment of the invention.

To sum up, the invention relates to a method, a device and a system for monitoring the IGBT junction temperature, wherein the linear relationship between each turn-off DC bus ringing peak voltage and the corresponding turn-off IGBT junction temperature, the phase current direction, and the initial and secondary states of a half-bridge arm are used to accurately determine the monitoring time of the turn-off DC bus ringing peak voltage, thereby obtaining the IGBT junction temperature at a converter level with higher sensitivity and resolution. More importantly, the IGBT junction temperature obtained using the junction temperature monitoring method provided by the invention is an appropriate converter-level parameter, which has a good application prospect in multi-IGBT junction temperature estimation. In addition, the bus voltage ringing of a power electronic converter, which is free from the impact of parasitic parameters inside an IGBT module, is independent from the degradation of the bond wires inside an IGBT. The monitoring method provided by the invention can monitor the junction temperature of all IGBTs in a converter by monitoring the DC bus ringing peak voltage. The method has the advantages of a less complicated monitoring circuit, a simplified monitoring circuit structure, low costs, convenient installation, high resolution, noninterference with the circuit operation, independence from the failure of bond wires, and the like.

It should be understood that the foregoing detailed description of the present invention has been presented only for exemplary illustrations and explanations of the principles of the present invention, and not for the purpose of limiting the invention. Accordingly, any modifications, equivalent replacements and improvements, etc. which are made within the spirit and scope of the present invention, are supposed to be included within the protection scope of the present invention. Furthermore, the appended claims of the present invention are intended to cover all such modifications and changes which fall within the scope and bound of the appended claims, or their equivalents.

What is claimed is:

1. A method for monitoring an IGBT junction temperature, wherein the method monitors the IGBT junction temperature in a converter, comprising the following steps:
    measuring a DC bus voltage steady-state value;
    monitoring a phase current of a phase where the IGBT is located, and determining a monitoring time of the IGBT junction temperature according to a direction of the phase current, an initial state of a half-bridge arm, and a secondary state of the half-bridge arm where the IGBT is located;
    monitoring the DC bus voltage at the junction temperature monitoring time, which in turn serves as a DC bus ringing peak voltage of the IGBT;
    and determining the junction temperature of the IGBT based on the DC bus ringing peak voltage, the DC bus voltage steady-state value, and the phase current.

2. The method of claim 1, further comprising:
    monitoring the phase current,
    and obtaining the DC bus ringing peak voltage of the IGBT when the phase current reaches a peak.

3. The method according to claim 1, wherein the step of determining the monitoring time of the IGBT junction temperature according to the direction of the phase current and the initial state of the half-bridge arm and the secondary state of the half-bridge arm, comprises:
    determining the monitoring time of the IGBT junction temperature according to the following logic transfer equation:

$$T_{upper}=CV_0V_1,$$

$$T_{lower}=CV_0V_1,$$

wherein $T_{upper}$ is the junction temperature monitoring time of an upper IGBT on the half-bridge arm; $T_{lower}$ is the junction temperature monitoring time of a lower IGBT on the half-bridge arm; C is the current direction of the phase where the IGBT is located, wherein a current flowing out of the half-bridge arm is positive and a current flowing into the half-bridge arm is negative; and $V_0$ is the initial state of the half-bridge arm in the phase where the IGBT is located, and $V_1$ is the secondary state of the half-bridge arm in the phase where the IGBT is located.

4. The method of claim 3, wherein the step of determining the junction temperature of the IGBT based on the DC bus ringing peak voltage, the DC bus voltage steady-state value, and the phase current, comprises:
    determining the junction temperature of the IGBT according to the following equation:

$$V_{bus\_m}=V_{bus}+(a+bT)V_{bus}i_L,$$

wherein T is the junction temperature of the IGBT; $V_{bus}$ is the DC bus voltage steady-state value; $i_L$ it is the phase current; $V_{bus\_m}$ is the peak voltage of the DC bus ringing; and a is a first calibration coefficient, and b is a second calibration coefficient.

5. The method of claim 4, wherein the measuring the DC bus voltage steady-state value $V_{bus}$ comprises:
    sampling the DC bus voltage;
    and processing the sampled DC bus voltage with a low-pass filter to obtain the DC bus voltage steady-state value $V_{bus}$.

6. The method of claim 5, wherein the step for monitoring the DC bus voltage at the junction temperature monitoring time, which in turn serves as the DC bus ringing peak voltage $V_{bus\_m}$ of the IGBT, comprises:
    sampling the DC bus voltage at the junction temperature monitoring time;
    and processing the sampled DC bus voltage with a high-pass filter to obtain the DC bus ringing peak voltage $V_{bus\_m}$.

7. A device for monitoring an IGBT junction temperature, wherein the device monitors the IGBT junction temperature in a converter, comprising a DC bus voltage steady-state value acquisition unit, a junction temperature monitoring time determination unit, a DC bus ringing peak voltage acquisition unit, and a junction temperature determination unit; wherein,
    the DC bus voltage steady-state value acquisition unit measures a DC bus voltage steady-state value;
    the junction temperature monitoring time determination unit monitors a phase current of a phase where the IGBT is located, and determines a monitoring time of the IGBT junction temperature according to a direction of the phase current, an initial state of a half-bridge arm, and a secondary state of the half-bridge arm where the IGBT is located;
    the DC bus ringing peak voltage acquisition unit monitors the DC bus voltage at the junction temperature monitoring time, which in turn serves as a DC bus ringing peak voltage of the IGBT; and
    the junction temperature determination unit determines the junction temperature of the IGBT based on the DC bus ringing peak voltage, the DC bus voltage steady-state value, and the phase current.

8. The device of claim 7, wherein the junction temperature monitoring time determination unit determines the monitoring time of the IGBT junction temperature according to the direction of the phase current and the initial and secondary states of the half-bridge arm where the IGBT is located by:
    determining the monitoring time of the IGBT junction temperature according to the following logic transfer equation:

$$T_{upper}=CV_0V_1,$$

$$T_{lower}=CV_0V_1,$$

wherein $T_{upper}$ is the junction temperature monitoring time of an upper IGBT on the half-bridge arm; $T_{lower}$ is the junction temperature monitoring time of a lower IGBT on the half-bridge arm; C is the current direction of the phase where the IGBT is located, wherein a current flowing out of the half-bridge arm is positive and a current flowing into the half-bridge arm is negative; and $V_0$ is the initial state of the half-bridge arm in the phase where the IGBT is located, $V_1$ is the secondary state of the half-bridge arm in the phase where the IGBT is located, $V_0$ and $V_1$ are 1 when the IGBT is turned on, and $V_0$ and $V_1$ are 0 when the IGBT is turned off.

9. The device of claim 8, wherein the junction temperature determination unit determines the junction temperature of the IGBT based on the DC bus ringing peak voltage, the steady-state value of the DC bus voltage, and the phase current by:

determining the IGBT junction temperature according to the following equation:

$$V_{bus\_m} = V_{bus} + (a+bT)V_{bus}i_L,$$

wherein T is the junction temperature of the IGBT; $V_{bus}$ is the DC bus voltage steady-state value; $i_L$ is the phase current; $V_{bus\_m}$ is the peak voltage of the DC bus ringing; and a is a first calibration coefficient, and b is a second calibration coefficient.

10. A system configured to monitor an IGBT junction temperature, comprising a converter, a control and signal processor, and an IGBT junction temperature monitoring device, wherein,
the converter, which is configured to supply power to a load, comprises 2n IGBTs which constitute n half-bridge structures, wherein n is a natural number greater than or equal to 1;
the control and signal processor controls an on-off state of the IGBT on each half bridge structure;
and the IGBT junction temperature monitoring device comprises the IGBT junction temperature monitoring device of claim 7, which is configured to monitor the IGBT junction temperature in the converter.

11. The system of claim 10, wherein the junction temperature monitoring time determination unit determines the monitoring time of the IGBT junction temperature according to the direction of the phase current and the initial and secondary states of the half-bridge arm where the IGBT is located by:
determining the monitoring time of the IGBT junction temperature according to the following logic transfer equation:

$$T_{upper} = CV_0V_1,$$

$$T_{lower} = CV_0V_1,$$

wherein $T_{upper}$ is the junction temperature monitoring time of an upper IGBT on the half-bridge arm; $T_{lower}$ is the junction temperature monitoring time of a lower IGBT on the half-bridge arm; C is the current direction of the phase where the IGBT is located, wherein a current flowing out of the half-bridge arm is positive and a current flowing into the half-bridge arm is negative; and $V_0$ is the initial state of the half-bridge arm in the phase where the IGBT is located, $V_1$ is the secondary state of the half-bridge arm in the phase where the IGBT is located, $V_0$ and $V_1$ are 1 when the IGBT is turned on and, $V_0$ and $V_1$ are 0 when the IGBT is turned off.

12. The system of claim 11, wherein the junction temperature determination unit determines the junction temperature of the IGBT based on the DC bus ringing peak voltage, the steady-state value of the DC bus voltage and the phase current by:
determining the IGBT junction temperature according to the following equation:

$$V_{bus\_m} = V_{bus} + (\alpha+bT)V_{bus}i_L,$$

wherein T is the junction temperature of the IGBT; $V_{bus}$ is the DC bus voltage steady-state value; $i_L$ is the phase current; $V_{bus\_m}$ is the peak voltage of the DC bus ringing; and a is a first calibration coefficient, and b is a second calibration coefficient.

* * * * *